United States Patent
Chan et al.

(10) Patent No.: US 8,975,880 B2
(45) Date of Patent: Mar. 10, 2015

(54) INTERNAL CAPACITOR LINEAR REGULATOR WITH TRANSIENT DIP COMPENSATOR FOR INTERNAL-SWITCH SWITCHING REGULATOR

(75) Inventors: Hua Beng Chan, Singapore (SG); Deyu Chen, Singapore (SG); Queenie Le, Singapore (SG)

(73) Assignee: Broadcom Corporation, Irvine, CA (US)

( * ) Notice: Subject to any disclaimer, the term of this patent is extended or adjusted under 35 U.S.C. 154(b) by 547 days.

(21) Appl. No.: 13/243,041

(22) Filed: Sep. 23, 2011

(65) Prior Publication Data

US 2013/0076320 A1    Mar. 28, 2013

(51) Int. Cl.
*G05F 1/00* (2006.01)
*H02M 3/158* (2006.01)

(52) U.S. Cl.
CPC .......... *H02M 3/1588* (2013.01); *Y02B 70/1466* (2013.01); *H03K 2217/0081* (2013.01)

USPC .................. 323/271; 323/272; 323/288

(58) Field of Classification Search
USPC ................. 323/242, 271, 272, 288
See application file for complete search history.

(56) References Cited

U.S. PATENT DOCUMENTS

| | | | |
|---|---|---|---|
| 7,064,531 B1 * | 6/2006 | Zinn | 323/268 |
| 7,759,916 B2 * | 7/2010 | Kleveland | 323/268 |
| 7,923,976 B2 * | 4/2011 | Al-Shyoukh et al. | 323/270 |
| 2003/0128015 A1 * | 7/2003 | Zuniga et al. | 323/282 |

* cited by examiner

*Primary Examiner* — Emily P Pham
(74) *Attorney, Agent, or Firm* — Sterne, Kessler, Goldstein & Fox P.L.L.C.

(57) ABSTRACT

A switching regulator arrangement utilizes internal capacitors rather than external capacitors for driving output power transistors. Low-dropout linear voltage regulators together with a dip compensation circuit provide an intermediate supply voltage for driving power transistors under circumstances in which a supply voltage is greater than a gate drive voltage of the power transistor, allowing for a more efficient absorption of transient current.

14 Claims, 11 Drawing Sheets

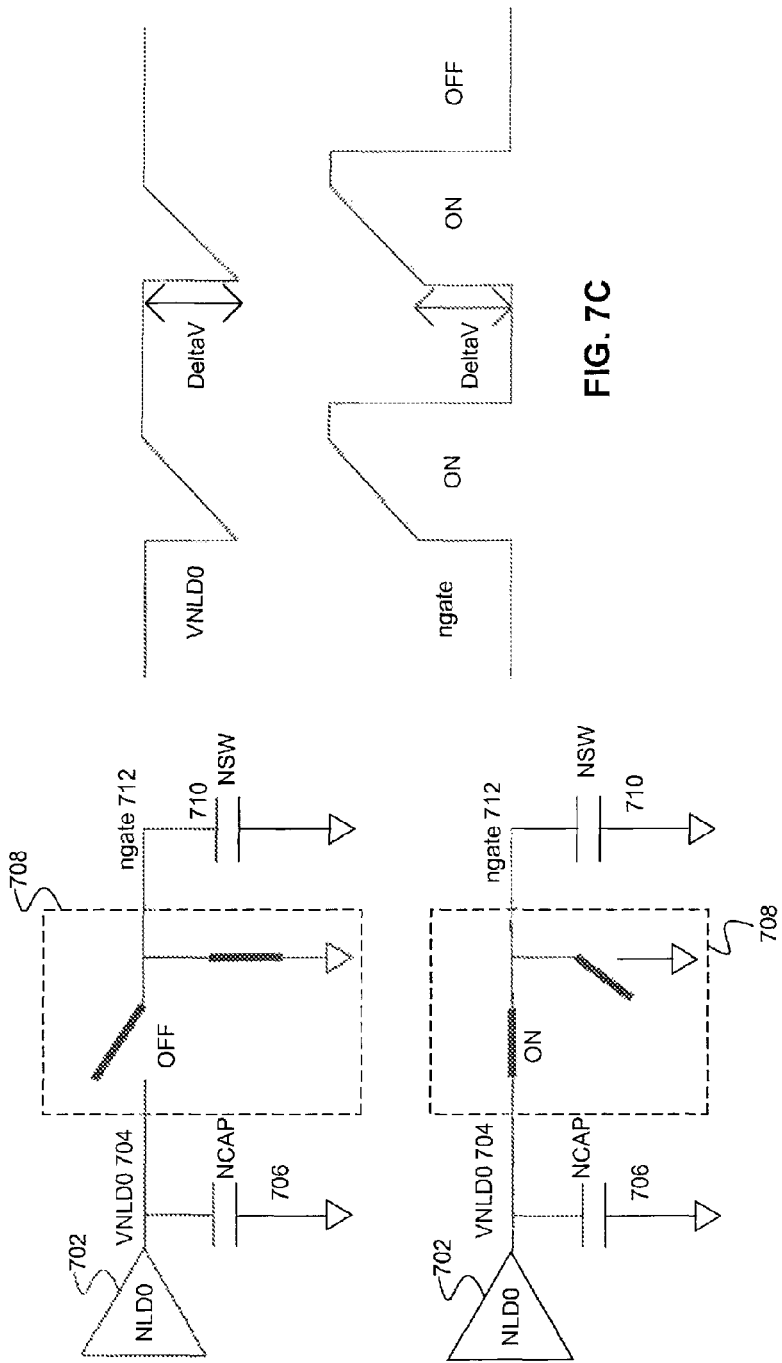

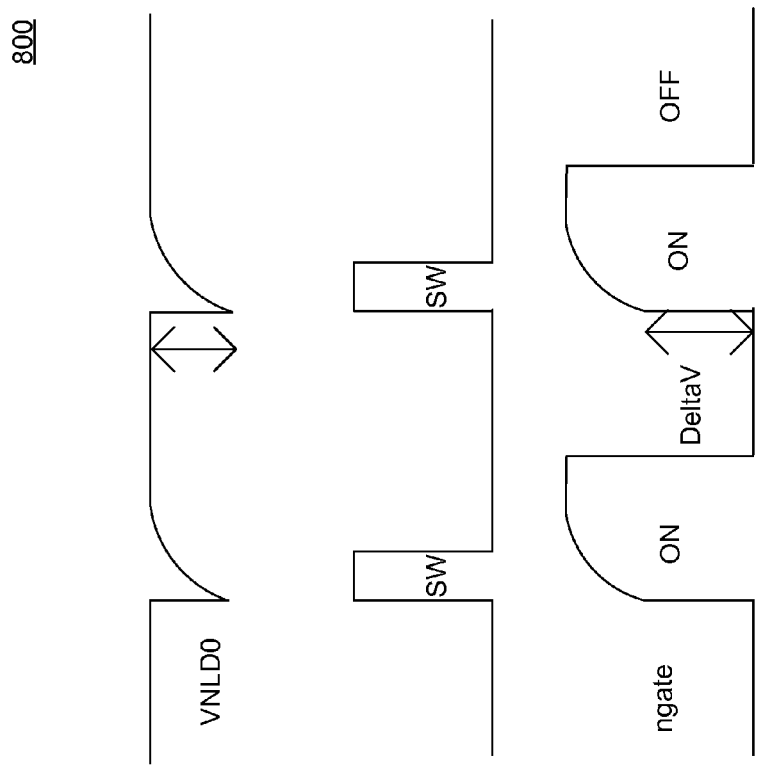
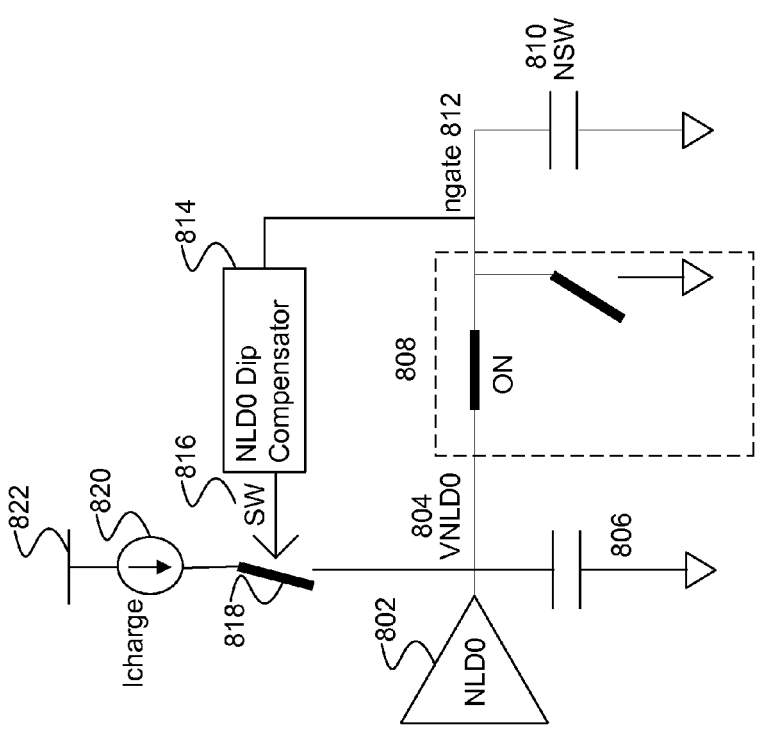
FIG. 8B
FIG. 8A

INTERNAL CAPACITOR LINEAR REGULATOR WITH TRANSIENT DIP COMPENSATOR FOR INTERNAL-SWITCH SWITCHING REGULATOR

BACKGROUND

1. Field of Invention

Embodiments described herein generally relate to switching regulators, and more particularly integrated circuit switching regulators which generate internal supply voltages for driving the power switches. More specifically, the invention relates to switching regulators in which low-dropout voltage regulators ("LDOs") provide an intermediate supply voltage for driving power transistors under circumstances in which a supply voltage is greater than a gate drive voltage of a power transistor of the regulator.

2. Background Art

Various switching regulator arrangements are intended to be operated with an external capacitor to provide low impedance for driving the power switches. Such arrangements are inconvenient in part because an integrated circuit chip including the regulator requires additional pins for connection to the external capacitor. Furthermore, there must be sufficient room in a device including the switching regulator to house the external capacitor.

Accordingly, what is needed is a switching regulator that can absorb switching energy when driving the output power switches utilizing an internal capacitor without the need for an external capacitor.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 7A, 7B, and 7C illustrate certain aspects of the operation of a switching regulator and waveforms of signals at different elements of an exemplary embodiment of a switching regulator according to the invention.

FIGS. 8A and 8B illustrate certain additional aspects of a switching regulator and waveforms of signals at different elements of an exemplary embodiment of a switching regulator according to the invention.

Figure 9A:
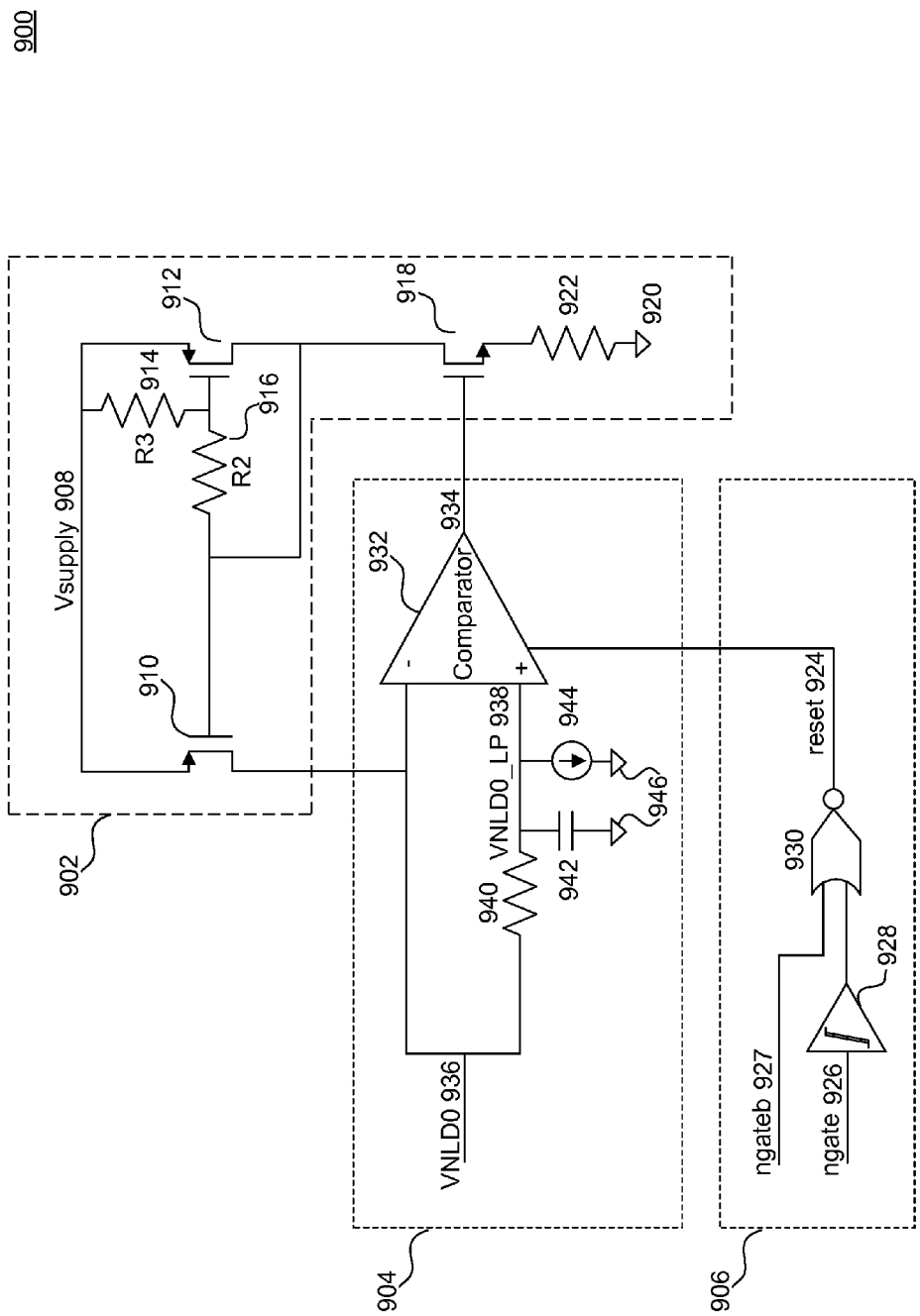
Figure 9B:
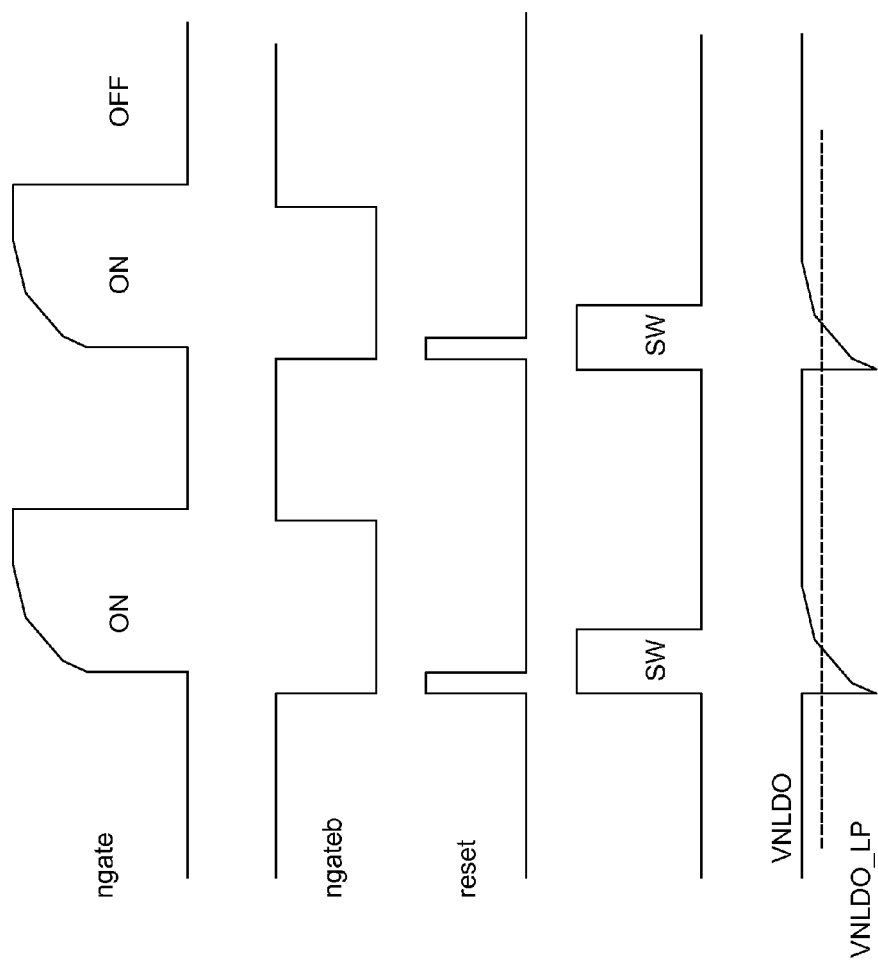

FIGS. 9A and 9B illustrate certain aspects of a dip compensator and waveforms of signals at different elements of a dip compensator of an exemplary embodiment of a switching regulator according to the invention.

Figure 10:
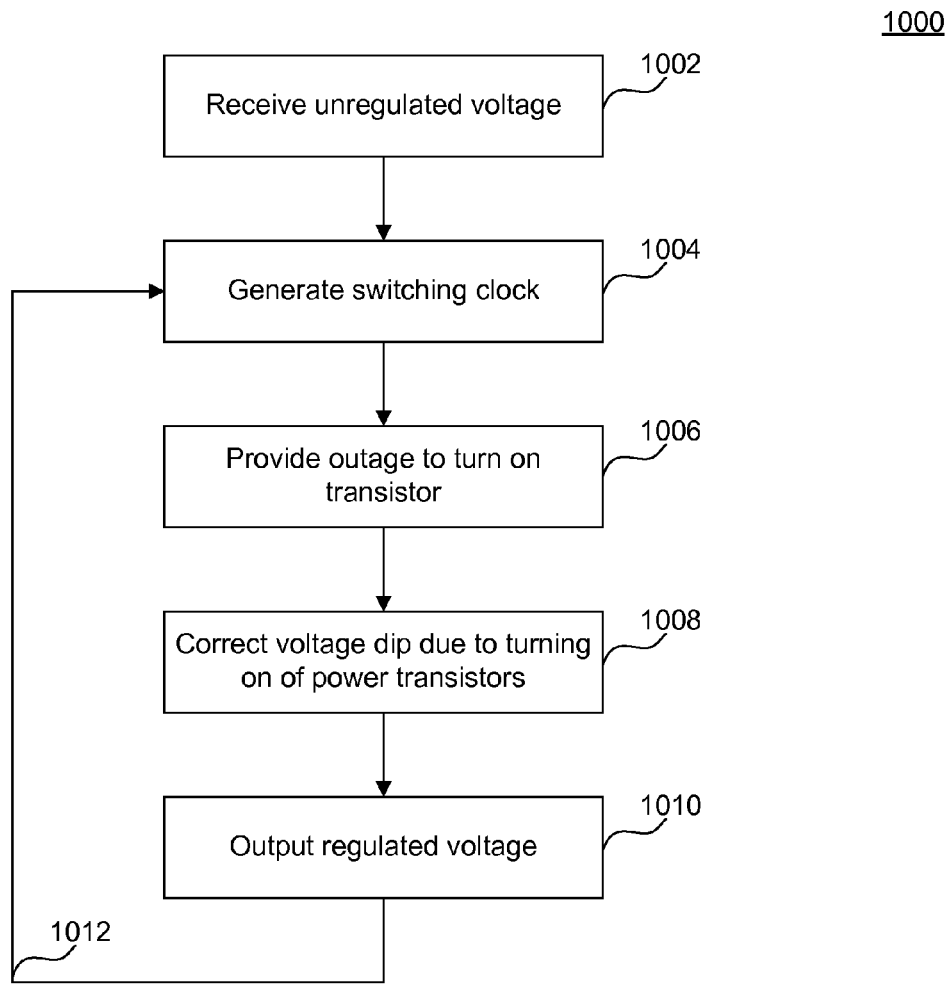

FIG. 10 is a flowchart 1000 of a process illustrating operation of an embodiment of a switching regulator according to the invention.

The invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

Figure 1:
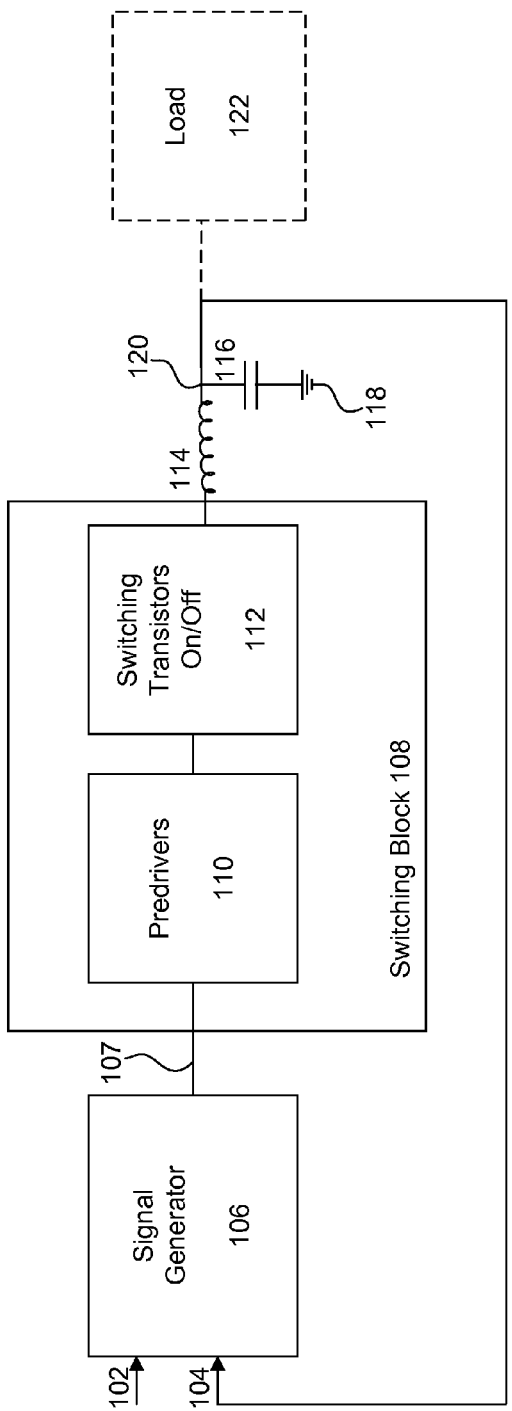
FIG. 1 (Prior Art) is a block diagram of a known switching regulator.

FIG. 1 (Prior Art) is a block diagram of a known switching regulator 100. The switching regulator 100 includes a signal generator 106 which is provided an unregulated voltage 102 and a loopback voltage 104. The signal generator 106 provides a signal 107 to a switching block 108. Within the switching block 108, the signal 107 is first provided to a pre-drivers block 110. The output of the pre-drivers block 110 is coupled to a switching transistors block 112. Switching transistors of switching transistors block 112 are switched "ON" and "OFF" by the output provided by the pre-driver block 110. An output of the switching block 108, is provided to an inductor 114 and an external capacitor 116 which is connected to a ground 118. A regulated voltage 120 is provided to a load 122.

Figure 2:
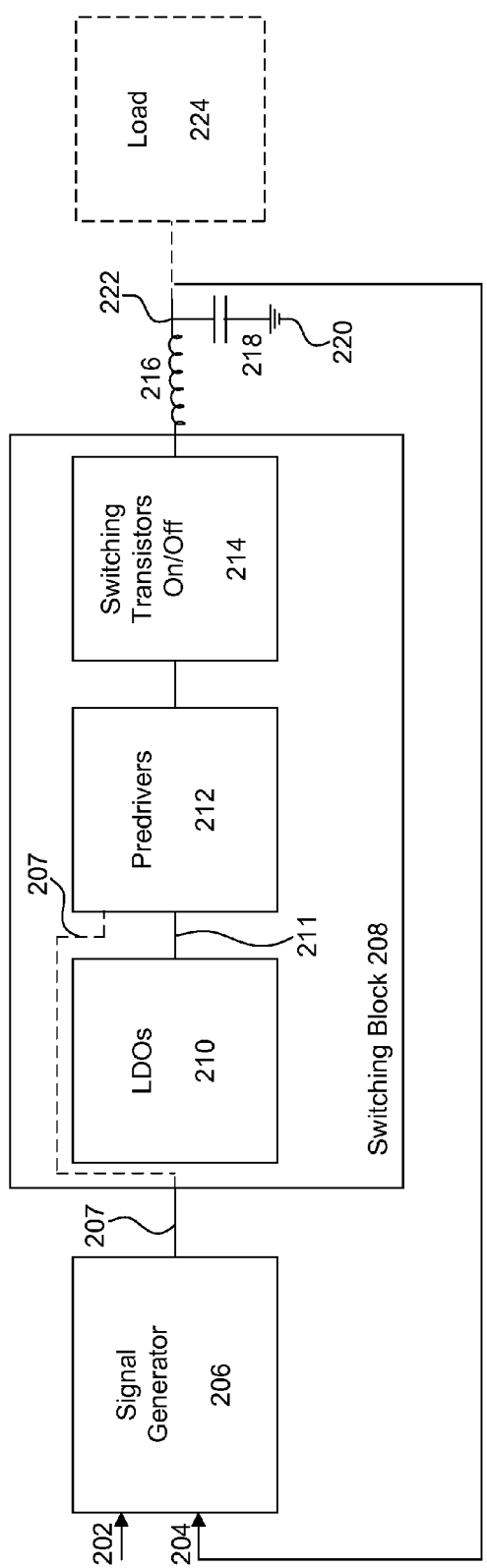
FIG. 2 (Prior Art) is a block diagram of another known switching regulator.

FIG. 2 (Prior Art) is a block diagram of another known switching regulator 200.

Switching regulator 200 includes a signal generator 206 receiving an input unregulated voltage 202 and a loopback voltage 204. Inductor 216, external capacitor 218, ground 220 and load 222 function essentially the same as their respective counterpart elements shown in FIG. 1 (Prior Art). Signal generator 206 provides a signal 207 to a switching block 208. Within the switching block 208, Low-dropout regulators ("LDOs") 210 provide an output 211 which is coupled, along with the signal 207 from signal generator 206, to a pre-drivers block 212. The output of pre-drivers block 212 is coupled to the switching transistors block 214. In switching transistors block 214, switching transistors are turned "ON" and "OFF" by the output provided by the pre-drivers block 212. An output of the switching block 208, is provided to an inductor 216 and an external capacitor 218 which is connected to a ground 220. A regulated voltage 222 is provided to load 224.

Figure 4:
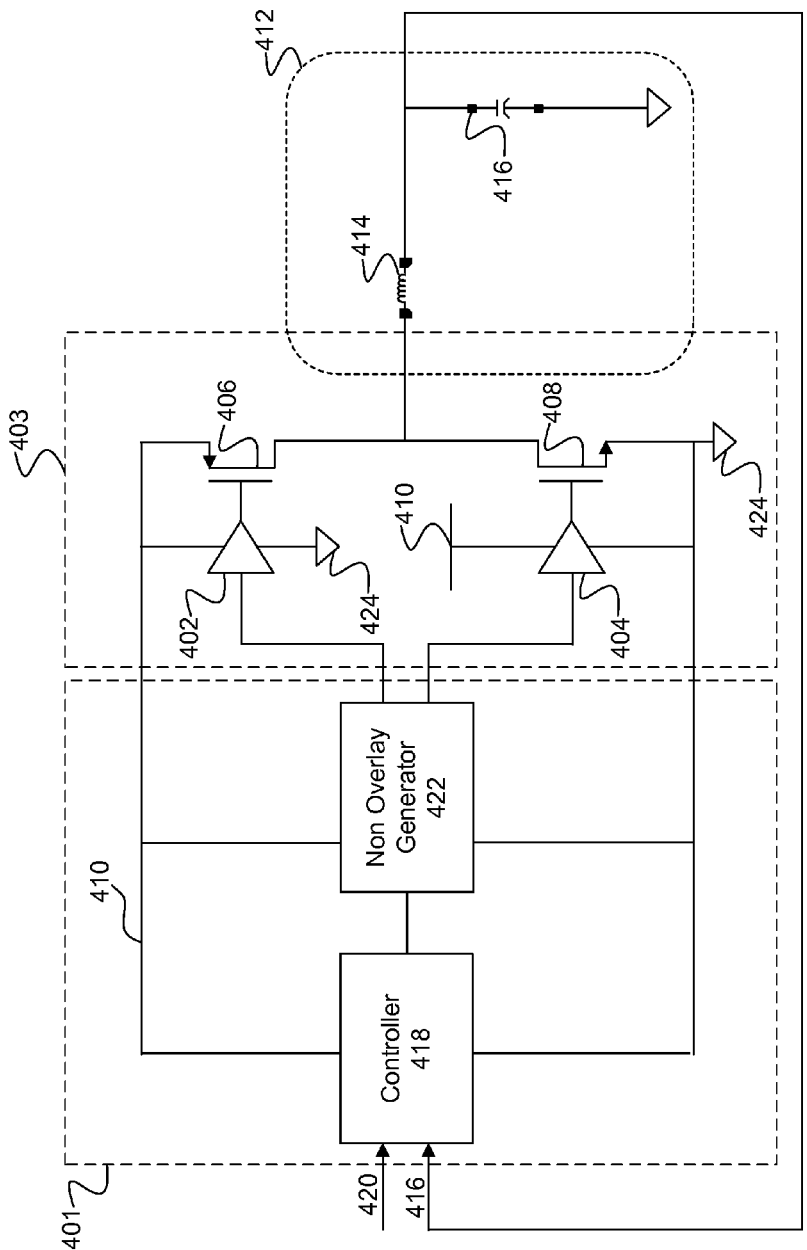
FIG. 4 (Prior Art) is schematic diagram of a known switching regulator.

FIG. 4 (Prior Art) is a schematic diagram of a known switching regulator 400. A signal generator 401 may be functionally similar to signal generator 106. A switching block 403 may function similarly to switching block 108. The switching regulator 400 includes respective pre-drivers 402 and 404 coupled to a p-type switching transistor 406 and a n-type transistor 408. A supply voltage 410 is provided to pre-drivers 402 and 404. The respective drains of the p-type transistor 406 and the n-type transistor 408 are coupled to external components 412. These external components 412 including an inductor 414 and a capacitor 416 provide a loopback voltage 416 to the controller 418, which also receives a reference voltage 420. A controller 418 drives a Non Overlap Generator 422. Pre-drivers 402 and 404 are connected to a ground 424. Since, capacitor 416 is an external capacitor (external to an integrated circuit in chip in which switching regulator 400 is formed), the gate drive voltage of the respective transistors (406 and 408) can be equal to the supply voltage 410. This equal level of the gate drive voltages and the supply voltage 410 allows there to be no over-voltage stress on any of the transistor junctions.

Figure 5:
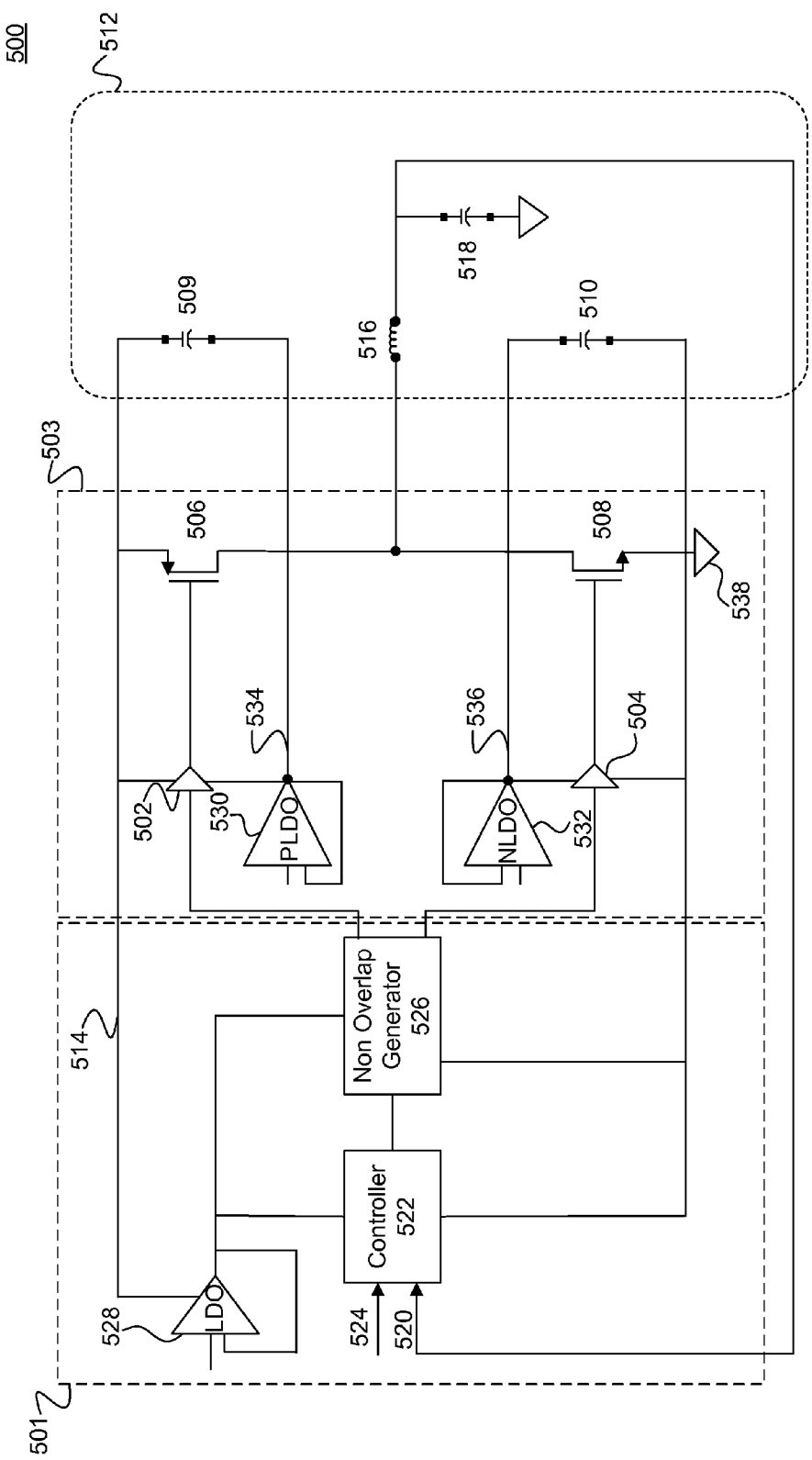
FIG. 5 (Prior Art) is a schematic diagram of another known switching regulator.

FIG. 5 (Prior Art) is a schematic diagram of another known switching regulator 500. Signal generator 501 is functionally similar to signal generator 206 and switching block 503 is functionally similar to switching block 208. Switching regulator 500 includes pre-drivers 502 and 504 coupled to respective p-type switching transistor 506 and a n-type switching transistor 508. Two off-chip capacitors 509 and 510 that are a part of external components 512, each having a value of 100 nF, are provided to absorb transient current from the switching of respective power transistors 506 and 508.

The respective drains of the p-type transistor 506 and the n-type transistor 508 are coupled to external components 512. These external components 512 comprise of an inductor 516 and a capacitor 518, and provide a loopback voltage 520 to a controller 522. A reference voltage ("Vref") 524 is also provided to the controller 522.

The controller 522 along with a LDO (528) drives the Non Overlap Generator 526. Furthermore, a p-transistor side LDO ("PLDO") 530 and a n-transistor side LDO ("NLDO") 532, are provided to generate respective intermediate voltages ("VPLDO" 534 and "VNDLO" 536) for the respective switching transistors (506 and 508). A ground 538 provides a completed circuit path for current switched by switching transistors 506 and 508.

In this configuration the gate drive voltage of the transistors (506 and 508) is limited to the respective intermediate voltages (534 and 536). For p-type transistor 506, the maximum gate source voltage is limited to (Vsupply 514–VPLDO 534) whereas for n-type transistor 508, the gate source voltage is limited to (VNLDO 536–ground 538).

With shrinking process technology, it is desirable to reduce the gate drive potential for transistors. However, supply voltage has not been reduced. Therefore, to limit the gate drive voltage, intermediate voltages are needed to drive power transistors so that they can be operated in safe mode of operation condition that does not cause stress to the transistors.

Figure 3:
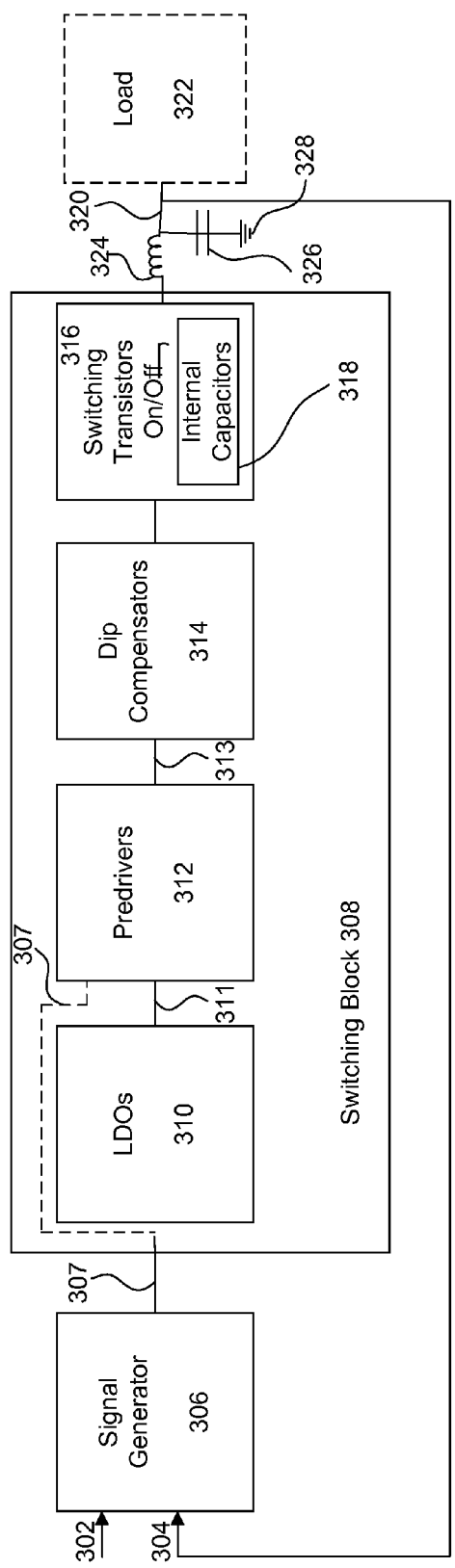
FIG. 3 is a block diagram of a switching regulator according to an exemplary embodiment of the present invention.

FIG. 3 is a block diagram of a switching regulator 300 according to an exemplary embodiment of the present invention. Switching regulator 300 includes a signal generator 306 having an unregulated voltage 302 input, and receiving a loopback voltage 304. Switching regulator 300 is intended to drive an external load 322. The signal generator 306 provides a signal 307 to a switching block 308. Within the switching block 308, an output 311 of LDOs 310, along with signal 307 from signal generator 306, is provided to the pre-drivers block 312. The output 313 of the pre-drivers block 312 is coupled to the dip compensators block 314, which contains dip compensators. Functional aspects of dip compensators are described later in the specification. The dip compensators block 314 is coupled to an input of the switching transistors block 316, which includes switching transistors that are switched "ON" and "OFF" based on the output 313 provided by the pre-drivers block 312. Internal capacitors 318 are provided within switching transistors block 316. An output of the switching block 308, is provided to an inductor 324 and an external capacitor 326 which is connected to a ground 328. A regulated voltage 320 which is equivalent to the loopback voltage 304 is provided to load 322.

Figure 6:
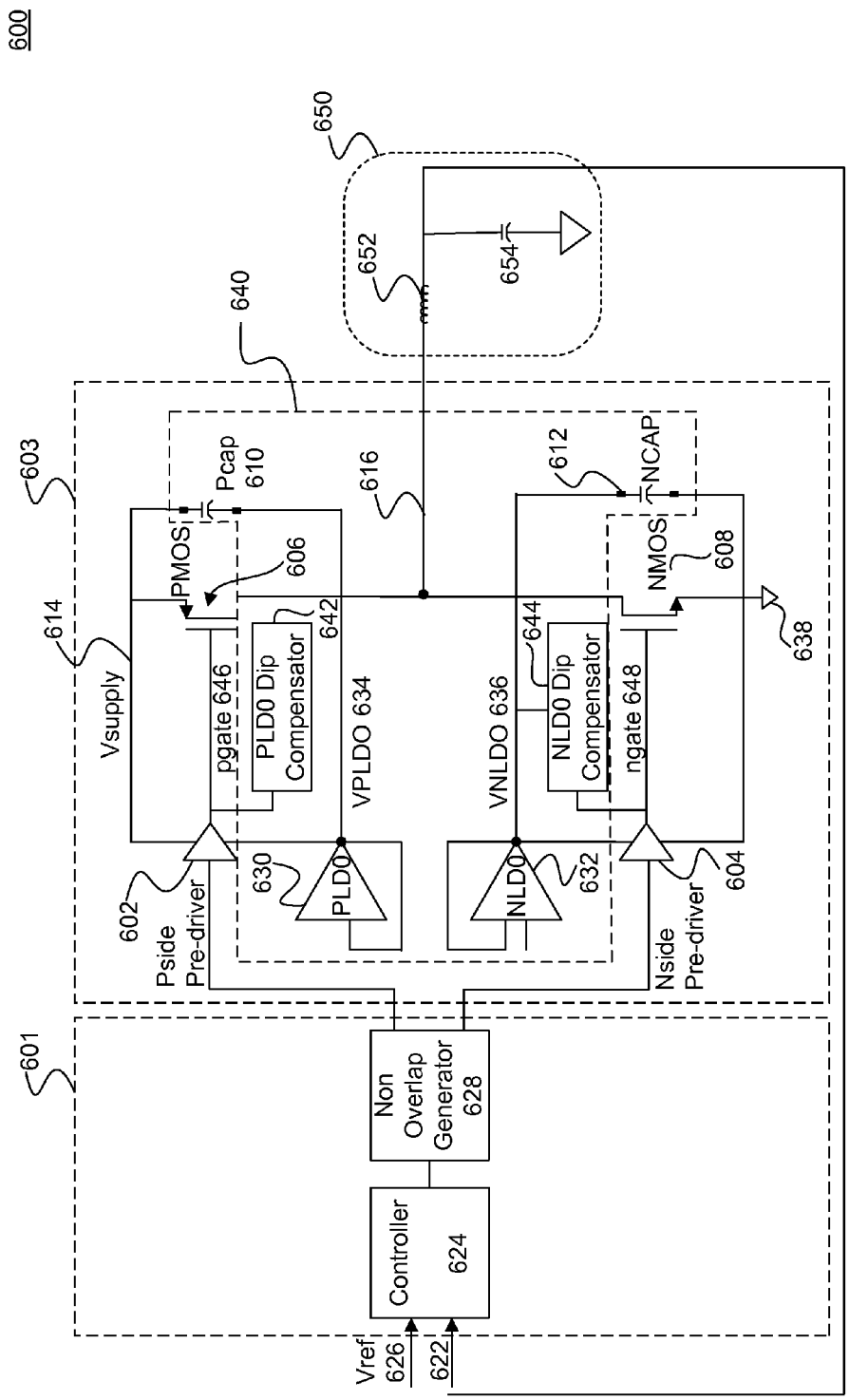
FIG. 6 is a schematic diagram of a switching regulator according to an exemplary embodiment of the present invention.

FIG. 6 is a schematic diagram illustrating certain aspects of a switching regulator 600 according to an exemplary embodiment of the present invention. In an embodiment, signal generator 601 may be functionally similar to signal generator 306 and switching block 603 may be functionally similar to switching block 308.

The switching regulator 600 includes pre-drivers 602 and 604 coupled to respective p-type transistor 606 and a n-type transistor 608. Two internal capacitors 610 and 612 that are coupled to a supply to ground rail of the respective pre-drivers (602 and 604) are included. In an embodiment, the internal capacitors 610 and 612 may have a capacitance in a range of 80 pF to 160 pF, with a preferable value of 140 pF. The capacitance level of the internal capacitors 610 and 612 is substantially equal to the gate capacitances of respective transistors 606 and 608. In other embodiments, the capacitance level of the internal capacitors 610 and 612 may be two times to the level of gate capacitances of respective transistors 606 and 608.

The respective drains of the p-type transistor 606 and the n-type transistor 608 are configured to provide an output voltage 616. The respective drains of the p-type transistor 606 and the n-type transistor 608 are coupled to external components 650. These external components 650 comprise of an inductor 652 and a capacitor 654, and provide a loopback voltage 622 to a controller 624. A reference voltage ("Vref") 626 is also provided to a controller 624. The controller 624 is coupled to a Non Overlap Generator 628. Furthermore, a p-transistor side LDO ("PLDO") 630 and a n-transistor side LDO ("NLDO") 632, are provided to generate respective intermediate voltages (VPLDO 634 and VNDLO 636) for the respective transistors (606 and 608). A ground connection 638 completes a circuit patch for currents switched by transistors 606 and 608.

An internal capacitor region 640 further includes a PLDO Dip Compensator 642 and NLDO Dip Compensator 644. The gate of the p-type transistor 606 is provided a value of pgate 646 and the gate of the n-type transistor 608 is provided a value of ngate 648.

Internally miller compensated LDOs (PLDO 630 and NLDO 632) are used to compensate for the load capacitance of the internal capacitors 610 and 612. The LDOs (630 and 632) provide DC voltage regulation for the intermediate supply (VPLDO 634 and VNDLO 636). The PLDO 630 and NDLO 632, each respectively act as a slow correction loop for the voltage regulation.

Working in parallel with each of the respective slow loops are the respective PLDO Dip Compensator 642 and the respective NLDO Dip Compensator 644. Each of the Dip Compensators (642 and 644), acts as a fast localized loop that corrects any voltage dip due to the turning "ON" of a power transistor.

FIG. 7A illustrates, certain aspects of a switching regulator 700 according to another exemplary embodiment of the present invention.

Aspects of a switching regulator 700, include a NLDO 702 that provides an intermediate voltage ("VNDLO") 704 to an internal capacitor 706 and a pre-driver 708. In FIG. 7A, the pre-driver 708 is illustrated in its "OFF" state and is connected to a Capacitor ("NSW Capacitor") 710. The NSW Capacitor 710 represents a gate capacitance of a n-type transistor (not shown). The voltage that is provided to the NSW Capacitor 710 is ngate 712.

FIG. 7B, illustrates certain aspects of the switching regulator 700 according to another exemplary embodiment of the present invention. Specifically, FIG. 7b illustrates aspects of a switching regulator 700, with the pre-driver 708 is illustrated in an "ON" state.

FIG. 7C, illustrates a waveform of the VNLDO 704 being provided by the NDLO 702, and the levels of ngate 712 in various states of being "ON" and "OFF". DeltaV in each of the respective waveform represents a change in the voltage level of that specific element.

When, the pre-driver 708 is in an "ON" state, a charge is transferred from the internal capacitor 706 to the NSW Capacitor 710. Since the turn-on time is quite fast and the NLDO 702 cannot react to the instantaneous change, VNLDO 704 will dip according to a charge transfer rule. If the capacitance of the internal capacitor 706 is equal to the capacitance of NSW Capacitor 710, then the amount of the voltage dip is equal to a level of VNLDO 704 divided by 2.

The recovery of the voltage will depend on the LDO output transconductance ("gm") and the recovery time constant is usually gm/(value of the internal capacitor 706 plus the value of the NSW Capacitor 710). One problem with this structure, is the large ripple effect on the LDO supply. Since the LDO will regulate to the average of this ripple, the maximum voltage will be higher and increase the risk of high voltage junction breakdown.

FIG. 8A illustrates, certain aspects of a switching regulator 800 according to another exemplary embodiment of the present invention.

A NDLO 802 provides an intermediate voltage 804 to an internal capacitor 806 and a pre-driver 808. In FIG. 8a, the pre-driver 808 is an "ON" state and is connected to a Capacitor ("NSW Capacitor") 810. However, the pre-driver 808 is configured to be able to be put in an "OFF" state as well. The NSW Capacitor 810 represents a gate capacitance of a n-type transistor (not shown). The voltage that is provided to the NSW Capacitor 810 is ngate 812. Coupled to the structure is a NLDO Dip Compensator 514 which provides a signal ("SW") 816 through a switch 818. A charging current ("Icharge") 820 is also provided to the switch 818, from a Voltage Supply 822.

The addition of the NLDO Dip Compensator 814 allows for a localized fast loop that reduces a voltage dip and speeds up recovery time. The NLDO dip compensator 814 provides the SW 816 that enables a charger to charge VNLDO 804 when pre-driver 808 is turned "ON". In this case the voltage dip will be reduced and the recovery can be controlled by controlling Icharge 820. This provides a fast charging path that pre-empts the on-chip capacitor charge loss, thereby reducing transient voltage drop.

FIG. 8B, illustrates the waveform of some of the elements shown in the FIG. 8a embodiment. A waveform of the VNLDO 804 being provided by the NDLO 802, and the levels of ngate 812 in various states of being "ON" and "OFF" are provided. DeltaV in each of the respective waveforms represents a change in the voltage level of that specific element. SW 816 is the signal that is provided by the NLDO dip compensator 814.

FIG. 9A is a schematic diagram illustrating certain aspects of a Dip Compensator 900 according to exemplary embodiments of the present invention. Dip Compensator 900 functional similarly to NLDO Dip Compensator 642. Dip Compensator 900 includes a NLDO Charger 902 and a NLDO Comparator 904 and a Schmitt Trigger section 906. The NDLO Charger 902 includes a supply voltage ("Vsupply") 908, two p-type transistors (910 and 912), resistors (914 and 916) coupled to a p-type transistor 912. Furthermore, an n-type transistor 918 connected to a ground 920 through a resistor 922 are included within a NDLO Charger 902.

The Schmitt Trigger section 906 generates reset pulses 924 by adding the output of a signal ngate 926 through a Schmitt trigger 928 and another signal ngateb 927. A NOR gate 930 generates the reset pulses 924 that are provided to a comparator 932 in the NLDO comparator 904.

The reset pulses 924 reset the output of a comparator 932 to send out a high level of a signal ("SW") 934, which enables turning "ON" of the NLDO Charger circuit 902. After the reset is released, thus the low level of SW 934 is provided, the comparator 932 will start to monitor the level of VNLDO 936 and a low pass version of VNLDO ("VNLDO LP") 938. VNLDO LP 938 is generated by the use of a resistor 940, a capacitor 942 and a current source 944 which are connected to a ground 946. As the NDLO charger circuit 902 charges up the level of VNLDO 936 above VNLDO LP 938, the comparator 932 will issue a low value of SW 934 that that turns off the NLDO charger circuit 902. At this point, the LDO will take over the recovery of the voltage level of VNLDO 936.

The amount of a charging current (not shown) produced by the NLDO charger 902 can be controlled by varying the resistance level of resistor 922. The voltage drop across resistor 922 is the source follower voltage of n-type transistor 918. If the SW 914 is at a high level and if the voltage being supplied is equal to VNLDO 936, then the voltage generated across resistor 922 R4 will be (VNLDO 936-gate-to-source voltage of n-type transistor 918) and the current generated will be (VNLDO 936-gate-to-source voltage of n-type transistor 918)/(resistance level of resistor 922).

This current will serve as a reference charge current that charges up the gate of transistor 910 first, as the initial current is blocked by resistor 916. The blocking of the current by the resistor 916 allows the transistor 910 gate to charge up quickly, providing a large current to an internal capacitor (not shown) to aid in controlling the voltage dip. After a particular time constant determined by the level of resistance of resistor 916 and the gate capacitance of transistor 912, the gate voltage of transistor 912 will be equal to the gate voltage of transistor 910. Thus, transistor 912 will behave as a conventional current mirror which provides a constant charging current to the internal capacitor. In an embodiment, the charging current may be determined by the current mirror ratio between transistor 910 and transistor 912. If the ratio is determined to be k. Then the charger current from transistor 910 will be equal to ((VNLDO 936−((level of gate voltage−level of source voltage) of transistor 918))/resistance of resistor 922)*k.

FIG. 9B, illustrates waveforms of signals at some of the elements shown in FIG. 9a. A waveform of the VNLDO 936 and VNLDO LP 938, SW 934, ngate 926, ngateb 927, and reset 924 are presented. Levels of ngate 927 in various states of being "ON" and "OFF" are presented.

One of ordinary skill in the art would comprehend that while schematics, structures and functionality of elements are described with relation to an n-type transistor in FIGS. 7-9, the same principles and functionality is applicable to elements related to a p-type transistor.

FIG. 10 is a flowchart 1000 illustrating the process by which switching regulators operate according to an exemplary embodiment of the present invention. An unregulated voltage is received in step 1002. Based on at least the unregulated voltage, a switching clock is generated in step 1004. Based on the switching clock, a pre-driver provides a voltage to a corresponding transistor to turn it on in step 1006. In step 1008, a corresponding dip-compensator corrects a voltage dip caused by the turning on of the power transistor. Step 1010 entails outputting of the regulated voltage by thee transistors. This output voltage is provided as a loopback voltage back to step 1104 for generation of the switching clock, in a step 1012. This output voltage may also be provided to a load.

CONCLUSION

The embodiments of the invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An integrated circuit switching regulator, comprising:
    an n-type transistor and a p-type transistor arranged in a circuit such that their respective drains are coupled together to provide an output of the switching regulator;
    a first pre-driver configured to provide a first gate voltage to the n-type transistor;
    a second pre-driver configured to provide a second gate voltage to the p-type transistor;
    a first low-dropout regulator (LDO) configured to provide a first DC voltage to the first pre-driver;
    a second LDO configured to provide a second DC voltage to the second pre-driver;
    a first dip compensator configured to charge a gate capacitance of the n-type transistor when the n-type transistor is turned on; and
    a second dip compensator configured to charge gate capacitance of the p-type transistor when the p-type transistor is turned on.

2. The integrated circuit switching regulator of claim 1, wherein the first dip compensator comprises:
    a first capacitor charger configured to charge the gate capacitance of the n-type transistor,
    a first comparator having an output coupled to the first capacitor charger, and
    a first reset pulse generator having an output directly coupled to the first comparator, and wherein the second dip compensator comprises:
    a second capacitor charger configured to charge the gate capacitance of the p-type transistor,
    a second comparator having an output coupled to the second capacitor charger; and
    a second reset pulse generator having an output directly coupled to the second comparator.

3. The integrated circuit switching regulator of claim 2, wherein an input of the first comparator is coupled to a gate of the n-type transistor.

4. The integrated circuit switching regulator of claim 2, wherein the first comparator is configured to turn on the first capacitor charger.

5. The integrated circuit switching regulator of claim 2, wherein the first reset pulse generator is configured to generate a reset pulse when the n-type transistor is turned on.

6. The integrated circuit switching regulator of claim 2, wherein the first comparator is configured to turn off the first capacitor charger.

7. The integrated circuit switching regulator of claim 2, wherein the first comparator has a first input coupled to an output of the first LDO and a second input coupled to a lowpass-filter version of the output of the first LDO.

8. The integrated circuit switching regulator of claim 7, wherein the first comparator is configured to turn off the first capacitor charger when the first input charges above the second input.

9. The integrated circuit switching regulator of claim 7, wherein the second input of the first comparator is coupled to a constant current source.

10. A method of providing a regulated voltage output from an unregulated voltage input, comprising:
    generating a switching clock based on at least the unregulated voltage;
    providing first and second gate voltages based on the switching clock;
    driving the respective gates of n-type and p-type transistors with respective first and second gate voltages to provide the regulated voltage output from coupled-together drains of the n-type and p-type transistors;
    correcting a voltage dip of capacitors associated with the respective n-type and p-type transistors, by adding a first signal to a first DC voltage when the n-type transistor is turned on and by adding a second signal to a second DC voltage when the p-type transistor is turned on.

11. The method of claim 10, further comprising:
    charging a gate capacitance of the n-type transistor to pre-empt a charge loss of an internal capacitor when the gate of the n-type transistor is driven.

12. The method of claim 10, wherein the first DC voltage is provided by a first voltage regulator, and wherein the second DC voltage is provided by a second voltage regulator.

13. The method of claim 12, wherein generating the switching clock is also based on the level of regulated voltage.

14. An integrated circuit switching regulator comprising:
    a dip compensator comprising an input and coupled to a current source;
    a pre-driver having an output and a supply rail, wherein the supply rail is coupled to the current source and the output is coupled to the input;
    an n-type transistor, wherein the output is coupled to a gate of the n-type transistor; and
    an on-chip capacitor coupled to the supply rail,
    wherein the dip compensator is configured to provide a fast charging path by the current source to a gate capacitance of the n-type transistor and to pre-empt discharge of the on-chip capacitor.

* * * * *